(12) United States Patent
Miyazaki

(10) Patent No.: US 6,297,141 B1
(45) Date of Patent: Oct. 2, 2001

(54) MOUNTING ASSEMBLY OF INTEGRATED CIRCUIT DEVICE AND METHOD FOR PRODUCTION THEREOF

(75) Inventor: Hirokazu Miyazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/476,348

(22) Filed: Jan. 3, 2000

Related U.S. Application Data

(62) Division of application No. 09/032,844, filed on Mar. 2, 1998.

(30) Foreign Application Priority Data

Mar. 3, 1997 (JP) .................................................. 9-048295

(51) Int. Cl.<sup>7</sup> .................................................. H01L 21/44
(52) U.S. Cl. .......................................... 438/612; 257/773
(58) Field of Search ................................ 438/106, 123, 438/124, 612, 613; 257/738, 773, 774, 778, 780

(56) References Cited

U.S. PATENT DOCUMENTS

| | | | |
|---|---|---|---|
| 4,954,877 | 9/1990 | Nakanishi et al. | 357/80 |
| 5,148,265 | 9/1992 | Khandros et al. | 357/80 |
| 5,459,368 | 10/1995 | Onishi et al. | 310/313 |
| 5,489,750 | * 2/1996 | Sakemi et al. | 174/261 |
| 5,783,865 | 7/1998 | Higashiguchi et al. | 257/774 |
| 5,784,262 | 7/1998 | Sherman | 361/777 |
| 6,051,093 | * 4/2000 | Tsukahara | 156/251 |
| 6,204,455 | * 3/2001 | Gilleo et al. | 147/261 |

FOREIGN PATENT DOCUMENTS

| | | |
|---|---|---|
| 63-95638 | 4/1988 | (JP) . |
| 6-504408 | 5/1994 | (JP) . |
| 6-510396 | 11/1994 | (JP) . |
| 8-8293 | 1/1996 | (JP) . |
| 9-45805 | 2/1997 | (JP) . |

* cited by examiner

Primary Examiner—David Nelms
Assistant Examiner—Quoc Hoang
(74) Attorney, Agent, or Firm—Sughrue, Mion, Zinn, Macpeak & Seas, PLLC

(57) ABSTRACT

A mounting assembly of an integrated circuit device includes an integrated circuit device having pads on its lower side, through holes formed in a mounting substrate at positions opposed to the pads of the integrated circuit device, and solders for connecting the pads of the integrated circuit device with the through holes. An electrode is provided on the inside wall of each through hole, and the mounting substrate includes therein wirings connected to the electrodes. The solder is filled into the through holes to such an extent that the solder filled in the through holes can be visually checked from the lower side of the substrate.

2 Claims, 2 Drawing Sheets

MOUNTING ASSEMBLY OF INTEGRATED CIRCUIT DEVICE AND METHOD FOR PRODUCTION THEREOF

This is a division of application Ser. No. 09/032,844 filed Mar. 2, 1998, the disclosure of which is incorporated herein by reference.

BACKGROUND OF THE INVENTION

1. Field of the Invention

The present invention relates to mounting assemblies of integrated circuit devices and methods for production thereof and more particularly, to a mounting assembly of an integrated circuit device in which an interconnection between an integrated circuit device and a mounting substrate is not exposed and also to a method for production thereof.

2. Description of the Related Art

An example of this type of prior art mounting assemblies of integrated circuit devices is disclosed in PCT International Publication Number 6-504408/94.

In FIG. 13 of the above Publication, a semiconductor chip assembly includes an integrated circuit device having a plurality of input/output terminals provided on the periphery of its top surface and a sheetlike interposer which is mounted on the integrated circuit device and has a plurality of bonding terminals provided on its periphery and connected to the plurality of input/output terminals of the integrated circuit device respectively. Provided on the sheetlike interposer are a plurality of terminals for external connection which are connected to the plurality of bonding terminals through wires, respectively. The input/output terminals of the integrated circuit device and the plurality of bonding terminals of the sheetlike interposer are interconnected by respective bonding wires.

The above prior art has such a problem that, since the input/output terminals of the integrated circuit device and the plurality of bonding terminals of the sheetlike interposer are interconnected by respective bonding wires, the bonding wires are externally exposed. This leads to another problem that the bonding tends to be easily separated, resulting in reduced reliability of the package.

In addition, since the bonding wires connecting the plurality of input/output terminals of the integrated circuit device and the plurality of bonding terminals of the sheetlike interposer are provided separately, a long manufacturing time is required.

SUMMARY OF THE INVENTION

It is therefore an object of the present invention to provide a mounting assembly of an integrated circuit device which can avoid exposure of an interconnection between the integrated circuit device and a wiring substrate on which the integrated circuit device is to be mounted.

Another object of the present invention is to provide a mounting assembly of an integrated circuit device in which interconnections between a plurality of input/output terminals of the integrated circuit device and a plurality of connecting terminals of a wiring substrate on which the integrated circuit device is to be mounted can be carried out simultaneously.

Yet another object of the present invention is to provide a mounting assembly of an integrated circuit device which can realize a firm interconnection between the integrated circuit device and a wiring substrate on which the integrated circuit device is to be mounted.

A further object of the present invention is to provide a mounting assembly of an integrated circuit device in which interconnections between the integrated circuit device and a wiring substrate, on which the integrated circuit device is to be mounted, can be easily, visually observed.

In accordance with an aspect of the present invention, the above objects can be attained by providing a mounting assembly of an integrated circuit device which comprises the integrated circuit device having input/output terminals on its underside surface, a substrate, on which the device is mounted, through-holes formed in a substrate at positions opposed to the input/output terminals of the integrated circuit device, and a connecting member for connecting the input/output terminals of the integrated circuit device and the through-holes.

The mounting assembly of the integrated circuit device has electrodes provided in the through-holes, wires connected to the electrodes, and a plurality of terminals provided on the bottom side of the substrate to be connected to the wires. The plurality of terminals are arranged in a lattice form.

As a connecting member, solder or electrically conductive resin may be employed.

Further, the substrate may have an external size smaller than or the same as the integrated circuit device, the connecting member may be exposed externally from the through-holes, and the connecting member exposed externally from the through-holes may be used as a connecting terminal.

In accordance with another aspect of the present invention, there is provided a method for manufacturing a mounting assembly of an integrated circuit device which includes the integrated circuit device having a plurality of input/output terminals provided on its underside and a substrate, in which, through-holes are provided at positions opposed to the input/output terminals of the integrated circuit device, said method comprising the steps of providing solder for each of the plurality of input/output terminals of the integrated circuit device, aligning the plurality of through-holes of the substrate with the plurality of input/output terminals of the integrated circuit device, and heating the integrated circuit device and substrate to melt the solder.

In accordance with a further aspect of the present invention, there is provided a method for manufacturing a mounting assembly of an integrated circuit device which includes the integrated circuit device having a plurality of input/output terminals provided on its bottom side and a substrate, in which through-holes are provided at positions opposed to the input/output terminals of the integrated circuit device, said method comprising the steps of providing a connecting member to each of the plurality of input/output terminals of the integrated circuit device, aligning the plurality of through-holes of the substrate with the plurality of input/output terminals of the integrated circuit device, and simultaneously effecting all the interconnections between the plurality of input/output terminals of the integrated circuit device and the plurality of through-holes of the substrate.

The above and other objects, features, and advantages of the present invention will become apparent from the following description referring to the accompanying drawings which illustrate an example of a preferred embodiment of the present invention.

DESCRIPTION OF THE PREFERRED EMBODIMENTS

A mounting assembly of an integrated circuit device and a method for production thereof in accordance with an embodiment of the present invention will be explained in detail with reference to the accompanying drawings.

Figure 1:
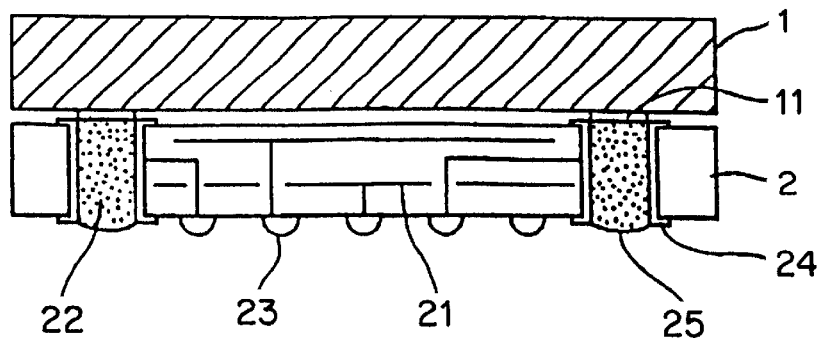
FIG. 1 is a cross-sectional view of a mounting assembly of an integrated circuit device in accordance with a first embodiment of the present invention.

Referring first to FIG. 1, there is shown an embodiment of a mounting assembly of an integrated circuit device in accordance with the present invention, which includes an integrated circuit device 1 and a mounting substrate 2.

The integrated circuit device 1 is provided on its bottom surface with a plurality of pads 11 for signal input/output or for power input. The pads 11 are arranged in rows along the periphery of the integrated circuit device 1. The pads 11 are made of copper or nickel.

The mounting substrate 2 has therein wires 21, a plurality of through holes 22 and external terminals 23. The outside size of the mounting substrate 2 is smaller than or equal to that of the integrated circuit device 1. The integrated circuit device 1 is mounted on the upper surface of the mounting substrate 2.

The mounting substrate 2 comprises a laminate made up of a plurality of insulating layers and a plurality of wiring layers. By stacking these insulating layers and wiring layers, a desired arrangement of wires 21 is formed in the mounting substrate 2. The insulating layers are made of preferably material having thermal expansion coefficient of the same as or similar to that of the integrated circuit device 1. More specifically, the material of the insulating layers is ceramic, while the material of the wiring layers is copper.

The through holes 22 each are disposed so as to be opposed to respective pads 11 provided on the integrated circuit device 1. The through holes 22 are formed so as to have a diameter of the same as or similar to that of the pads 11 of the integrated circuit device 1. More specifically the through holes 22 each have a diameter of 0.2 mm. A metallized electrode 24 is formed over the side surface of each of the through holes 22. The through holes 22 each are filled with solder 25.

The electrodes 24 are connected to the wires 21 in the mounting substrate 2. Each of the electrodes 24, which is formed by plating the inside wall of the through holes 22 with copper, has a thickness of 1 micron.

The external terminals 23 are arranged, on a lattice pattern, on the lower surface of the mounting substrate 2. The external terminals 23 are electrically connected respectively to the pads 11 of the integrated circuit device 1 through the wires 21, electrodes 24 and through-holes 22, respectively. That is, signals inputted from the external terminals 23 are transmitted to the integrated circuit device 1 through the wires 21, electrodes 24, solders 25 and pads 11 of the integrated circuit device 1.

The solder 25 interconnects electrically and mechanically the electrodes 24 provided on the inside surface of the through hole 22 and the pad 11 of the integrated circuit device 1. The solder 25 is filled into the through holes 22 to such an extent that the solder can be visually checked from the lower side of the mounting substrate 2. More preferably, the solder is filled so as to be exposed from the lower surface of the mounting substrate 2, and the solder 25 is made of Sn/Pb alloy.

Thus, in accordance with the present embodiment, the mounting substrate 2 to be mounted with the integrated circuit device 1 is provided with the through holes 22 at positions opposed to the pads 11 of the integrated circuit device 1 to connect the pads 11 to the through holes 22. Thus, the interconnection between the integrated circuit device 1 and the mounting substrate 2 is not exposed to the outside, with the result that the reliability of the connection can be improved.

Further, the solder 25 filled into the through holes 22 can be observed from the lower side of the mounting substrate 2, and therefore the connection between the pads 11 of the integrated circuit device 1 and the through holes 22 of the mounting substrate 2 can be checked.

A detailed explanation will next be made as to the method for fabricating the mounting assembly of the integrated circuit device of the present invention, by referring the drawings. The fabricating method of the present invention is featured by a step of simultaneously interconnecting a plurality of pads 11 of the integrated circuit device 1 and through-holes 22 of the mounting substrate 2 by means of a connecting member.

Figure 2A:
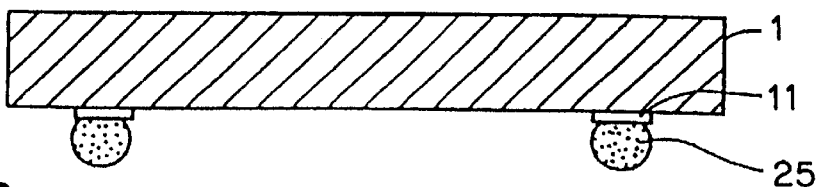
FIG. 2 shows a method for fabricating the mounting assembly of the embodiment.

Referring to a first step of FIG. 2(a), solder 25 is provided for each of the pads 11 provided on the lower surface of the integrated circuit device 1. The solder 25 is preferably comprised of a solder ball. The amount of each solder 25 is such that each through hole 22 of the mounting substrate 2 can be sufficiently filled with the solder.

Figure 2B:
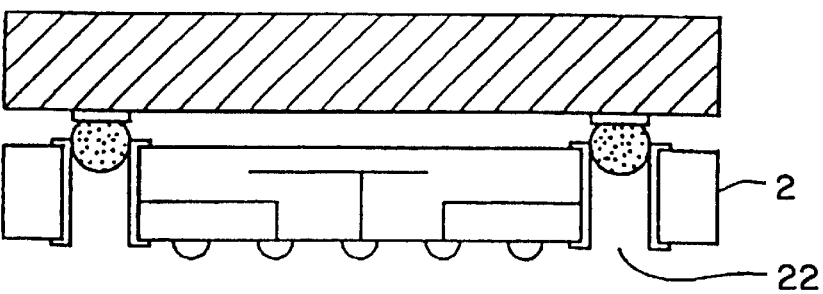

Referring next to a second step of FIG. 2(b), an alignment between the integrated circuit device 1 and the mounting substrate 2 is carried out. More in detail, the integrated circuit device 1 is positioned on the mounting substrate 2 so that the pads 11 on the lower side of the integrated circuit device 1 are opposed to the through holes 22 provided in the mounting substrate 2.

Figure 2C:
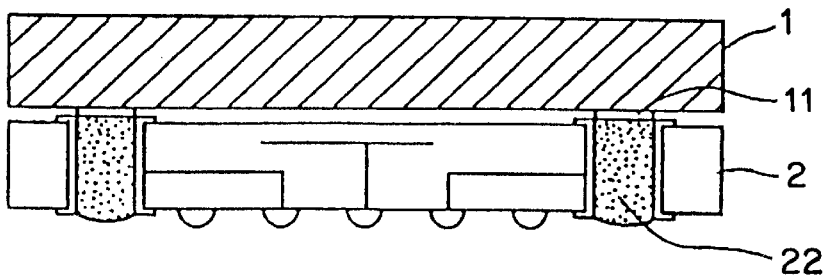

Referring to a third step of FIG. 2(c), both the integrated circuit device 1 and mounting substrate 2 are heated to melt the solders 25. The solders 25 are melted and filled into the through holes 22, so that the integrated circuit device 1 is electrically and mechanically connected to the mounting substrate 2.

In accordance with the method for producing the mounting assembly of the integrated circuit device of the foregoing embodiment, since the solders 25 is melted to connect the integrated circuit device 1 to the mounting substrate 2 by heating the whole of the mounting substrate 2 having there on the integrated circuit device 1, simultaneous connection can be realized between the pads 11 of the integrated circuit device 1 and the through holes 22.

Explanation will now be made in detail as to a second embodiment of the present invention, by referring to FIG. 3. The second embodiment of the present invention is featured in that the pads 11 provided on the lower side of the integrated circuit device 1 are electrically and mechanically connected to the through holes 22 of the mounting substrate 2 using electrically conductive resin. In other respects, the second embodiment is substantially the same as that of the first embodiment.

Figure 3:
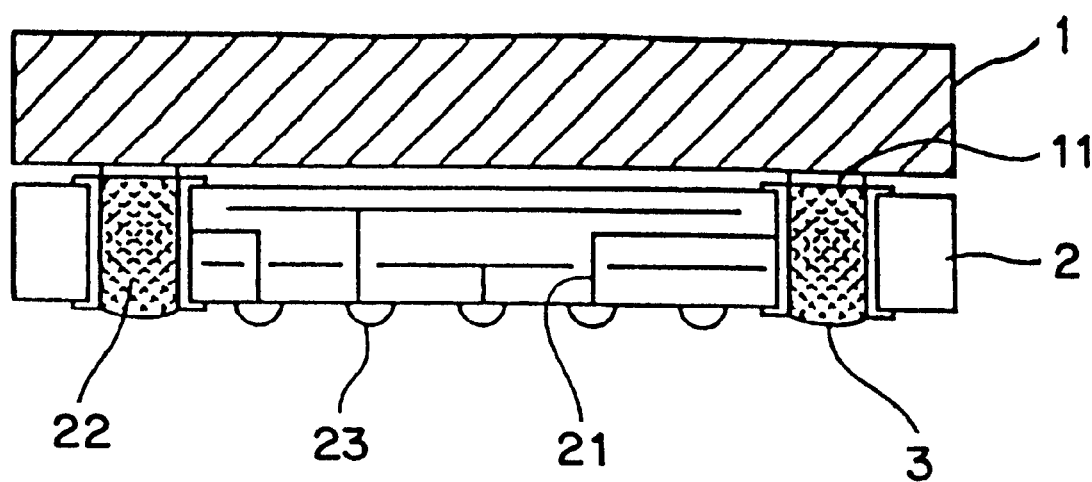
FIG. 3 is a cross-sectional view of a mounting assembly of an integrated circuit device in accordance with the second embodiment of the present invention.

Referring to FIG. 3, a conductive resin 3 is filled into each of through holes 22. The conductive resin 3 electrically connects the pad 11 of the integrated circuit device 1 and an electrode 24 provided on the inside wall of the through holes 22. The conductive resin 3 is, for example, an epoxy resin. Employment of the conductive resin 3 restrains amounts of heat applied to the integrated circuit device 1 and mounting substrate 2 as compared with solder.

A method for producing the mounting assembly of the integrated circuit device in accordance with the second embodiment of the present invention will next be explained with reference to FIG. 3.

The electrically conductive resin 3 is applied beforehand onto the pads 11 of the integrated circuit device 1. The conductive resin 3 is filled into the through holes 22 of the mounting substrate 2 beforehand. Next, the integrated circuit device 1 and mounting substrate 2 are oppositely positioned so that the pads 11 of the mounting substrate 2 are aligned with through holes 22 filled with the conductive resin 3 respectively. In the case that the conductive resin 3 is such thermosetting resin as epoxy resin, when heated, the pads 11 are connected simultaneously to the through holes 22, respectively.

Consequently, since the interconnection between the integrated circuit device 1 and mounting substrate 2 can be realized at low temperature in the present embodiment, any warpage of the mounting substrate 2 can be restrained, connection reliability can be improved and the amount of heat necessary to be applied to the integrated circuit device 1 can be reduced.

Although a plurality of insulating layers and a plurality of wiring layers are stacked on the mounting substrate 2 in the foregoing embodiments, the substrate may be made up of a single insulating layer and a single wiring layer provided thereon. In that case, a desired wiring is formed by the use of a single wiring layer. With such an assembly, since the thickness of the mounting substrate 2 in the stacking direction thereof can be reduced, the mounting height of the integrated circuit device can be advantageously reduced.

Though the insulating layers of the mounting substrate 2 are made of ceramic in the foregoing embodiments, the material of the insulating layers is not limited to the above example and the insulating layer may comprise such a flexible material as a polyimide film.

In the foregoing embodiments, further, a solder 25 exposed from the lower side of the mounting substrate 2 may be used as an electrode. Signals inputted from the electrodes 25 comprising exposed solder are transmitted to the pads 11 of the integrated circuit device 1 through the filled solder of the through holes 22. Such electrodes can be used more preferably as grounding electrodes, since the grounding electrodes have a width larger than that of the other wiring 21.

In the mounting assembly of the integrated circuit device of the present invention, it will be appreciated from the foregoing explanation that the mounting assembly having the integrated circuit device mounted thereon is provided with the through-holes at such positions as to be opposed to the input/output terminals provided on the lower side of the integrated circuit device to connect the input/output terminals of the integrated circuit device with the through-holes, whereby the interconnection between the integrated circuit device and mounting substrate can be prevented from being outwardly exposed, thereby improving the interconnection reliability.

Further, the connection between the input/output terminals of the integrated circuit device and the through-holes of the mounting substrate can be checked by observing the solder or conductive resin filled in the through-holes from the lower side of the mounting substrate.

In accordance with the method for producing the mounting assembly of the integrated circuit device of the present invention, since the integrated circuit device can be connected to the mounting substrate by heating the whole of the mounting substrate having the integrated circuit device mounted thereon to melt the solder or to thermally set the resin, the connections between input/output terminals of the integrated circuit device and through holes can be simultaneously effected.

It is to be understood that variations and modifications of embodiments of the invention disclosed herein will be evident to those skilled in the art. It is intended that all such modifications and variations be included within the scope of the appended claims.

What is claimed is:

1. A method for manufacturing a mounting assembly of an integrated circuit device, said mounting assembly including (1) an integrated circuit device having a surface on which a plurality of input/output terminals are provided, and (2) a substrate, said method comprising the steps of:

providing solder on each of said input/output terminals of said integrated circuit device, forming through-holes in said substrate at positions corresponding to said input/output terminals of said integrated circuit device, each of said through-holes having substantially the same diameter as a corresponding input/output terminal of said integrated circuit device, positioning said through-holes of said substrate respectively in opposition to said input/output terminals of said integrated circuit device, and heating said integrated circuit device and said substrate to melt said solder.

2. A method for manufacturing a mounting assembly of an integrated circuit device, said mounting assembly including (1) an integrated circuit device having a surface on which a plurality of input/output terminals are provided, and (2) a substrate, said method comprising the steps of:

providing connecting members respectively on said input/output terminals of said integrated circuit device, forming through-holes in said substrate at positions corresponding to said input/output terminals of said integrated circuit device, each of said through-holes having substantially the same diameter as a corresponding input/output terminal of said integrated circuit device, positioning said through-holes of said substrate respectively in opposition to said input/output terminals of said integrated circuit device, and simultaneously connecting said input/output terminals of said integrated circuit device with said through-holes of said substrate via said connecting members.

* * * * *